(12) United States Patent
Nabeshima

(10) Patent No.: US 8,179,659 B2
(45) Date of Patent: *May 15, 2012

(54) PLACEMENT CONFIGURATION OF MIM TYPE CAPACITANCE ELEMENT

(75) Inventor: Yutaka Nabeshima, Katano (JP)

(73) Assignee: Panasonic Corporation, Osaka (JP)

( * ) Notice: Subject to any disclaimer, the term of this patent is extended or adjusted under 35 U.S.C. 154(b) by 339 days.

This patent is subject to a terminal disclaimer.

(21) Appl. No.: 12/216,843

(22) Filed: Jul. 11, 2008

(65) Prior Publication Data

US 2008/0278885 A1    Nov. 13, 2008

Related U.S. Application Data

(63) Continuation of application No. 11/349,082, filed on Feb. 8, 2006, now Pat. No. 7,515,394.

(30) Foreign Application Priority Data

Feb. 15, 2005    (JP) .................................. 2005-037695

(51) Int. Cl.
*H01G 4/005* (2006.01)
*H01G 4/228* (2006.01)
(52) U.S. Cl. .................................... 361/303; 361/306.1
(58) Field of Classification Search .................. 361/303, 361/306.1, 306.3, 307, 309, 311
See application file for complete search history.

(56) References Cited

U.S. PATENT DOCUMENTS

| | | | |
|---|---|---|---|
| 5,565,809 A | 10/1996 | Shou et al. | |
| 5,966,047 A * | 10/1999 | Anderson et al. | 327/565 |
| 6,597,562 B1 | 7/2003 | Hu et al. | |
| 6,614,645 B1* | 9/2003 | Sakurai et al. | 361/328 |
| 7,515,394 B2* | 4/2009 | Nabeshima | 361/303 |
| 2003/0234415 A1 | 12/2003 | Chien | |
| 2006/0087004 A1 | 4/2006 | Furumiya et al. | |
| 2007/0217122 A1 | 9/2007 | Gevorgian et al. | |

FOREIGN PATENT DOCUMENTS

| | | | |
|---|---|---|---|
| JP | 07211860 A * | 8/1995 | |
| JP | 09-289286 | 11/1997 | |
| JP | 2001-203329 A | 7/2001 | |

* cited by examiner

*Primary Examiner* — Eric Thomas

(74) *Attorney, Agent, or Firm* — McDermott Will & Emery LLP

(57) ABSTRACT

A placement configuration of MIM type capacitance elements comprises a group of first capacitance elements in which the first capacitance elements as the MIM type capacitance elements are placed in tandem and a group of second capacitance elements in which the second capacitance elements as the MIM type capacitance elements are placed in tandem, wherein the group of first capacitance elements and the group of second capacitance elements are alternately placed in parallel with each other with an equal interval therebetween.

19 Claims, 8 Drawing Sheets

PLACEMENT CONFIGURATION OF MIM TYPE CAPACITANCE ELEMENT

RELATED APPLICATIONS

This application is a Continuation of U.S. application Ser. No. 11/349,082, filed Feb. 8, 2006, now U.S. Pat. No. 7,515,394 issued on Apr. 7, 2009, claiming priority of Japanese Application No. 2005-037695, filed Feb. 15, 2005, the entire contents of each of which are hereby incorporated by reference.

BACKGROUND OF THE INVENTION

1. Field of the Invention

The present invention relates to a placement configuration of an electrostatic capacitance element having a metal—insulation film—metal (MIM) structure, more particularly to a placement configuration of two MIM type capacitance elements having an identical capacitance value.

2. Description of the Related Art

An analog integrated circuit used in a mobile communication device such as a cellular telephone is provided with passive elements such as a capacitance element, a resistance and an inductor. As the capacitance element among the passive elements, which is particularly frequently used in an operational amplifier of a pipeline-type A/D converter, two capacitance elements having an identical capacitance value are used in order to eliminate any error generated in the A/D conversion, and a high relative precision is demanded between the two capacitance elements. The relative precision refers to a differential between capacitance values of the two capacitance elements that are identically structured ($\Delta C = 2 \times (C1-C2)/(C1+C2)$).

Examples of the capacitance element conventionally used in the integrated circuit include an MOS type capacitance element in which a thin oxide silicon ($SiO_2$) film or the like is sandwiched between an electrode such as a metallic film or a conductive polycrystal silicon (poly-Si) film and a silicon (Si) substrate, a two-layered poly-Si type capacitance element in which a thin $SiO_2$ layer or the like is sandwiched between two-layer conductive poly-Si, and the like. These capacitance elements have the following problems. One of the problems is that there is a large parasitic resistance because an impurity diffusive layer or a conductive poly-Si film in a supported substrate is used in one or both of the electrodes. The next problem is that a parasitic capacitance is increased because a distance by which the electrode and Si substrate are isolated from each other is approximately not more than a thickness of an insulation film for isolating the elements. Further, because a depletion layer in the Si substrate changes in response to an applied voltage, a value of the parasitic capacitance fails to remain constant with respect to the voltage.

In order to deal with the foregoing problems, an MIM (Metal Insulator Metal) type capacitance element, an example of which is recited in No. 2001-203329 of the Publication of the Unexamined Japanese Patent Applications, has been gathering attention. According to the cited document, metal films having a low resistance constitute upper and lower electrodes, and an upper-layer wiring is used as the electrodes so that the electrodes can be formed with an appropriate distance from the Si substrate. As a result, the parasitic resistance and the parasitic capacitance can be significantly reduced.

However, in the conventional constitution described above, if the two MIM type capacitance elements having the identical capacitance value are not carefully placed, the obtained relative precision is not as high as expected due to a variation generated in the capacitance insulation film when the film is formed, a variation generated in processing the capacitance electrode, and an influence of a parasitic capacitance from a peripheral circuit element.

The present invention aims to solve the foregoing problems, and a main object thereof is to regulate the placement of the two MIM type capacitance elements having the identical capacitance value to thereby realize such a placement configuration of the MIM type capacitance elements that a high relative precision can be obtained.

SUMMARY OF THE INVENTION

A placement configuration of MIM type capacitance elements according to the present invention comprises a group of first capacitance elements in which the first capacitance elements as the MIM type capacitance elements are placed in tandem and a group of second capacitance elements in which the second capacitance elements as the MIM type capacitance elements are placed in tandem. The group of first capacitance elements and the group of second capacitance elements are alternately placed in parallel with each other with an equal interval therebetween.

A placement configuration of MIM type capacitance elements according to the present invention places the first and second capacitance elements, which are the MIM type capacitance elements, alternately along row and column directions. An interval between the first and second capacitance elements adjacent to each other in the row direction and an interval between the first and second capacitance elements adjacent to each other in the column direction are all equalized.

A capacitance value of the MIM type capacitance element is regulated by an area of an upper electrode thereof. An organic resist film having a photosensitivity is often used as a mask material used in processing the upper electrode. Due to a high contractility of the photosensitive organic resist film, a dimension of the photosensitive organic resist film is reduced toward the center of a side of a pattern as a length of the side is increased. According to the present invention, the group of first capacitance elements and the group of second capacitance elements are alternately and equally spaced in parallel so that deterioration of the relative precision due to the variation of the dimension of the upper electrode can be controlled.

Further, a capacitance insulation film undergoes such a variation in film thickness that is distributed in a plane of a Si substrate due to a method or an equipment for forming the film. Therefore, when the group of first capacitance elements and the group of second capacitance elements are alternately and equally spaced in parallel, the deterioration of the relative precision in the row direction and the column direction, which results from the variation of the film thickness of the capacitance insulation film, can be controlled.

Further, according to the present invention, the first capacitance elements and the second capacitance elements, which are the MIM type capacitance elements, are alternately placed along the row and column directions, and the interval between the first and second capacitance elements adjacent to each other in the row direction and the interval between the first and second capacitance elements adjacent to each other in the column direction are all equalized. As a result, the relative precision can be improved in both of the row and column directions.

A shape of the upper electrode of the MIM type capacitance element is often rectangular. However, when the rectangular shape is adopted, there is a difference between each side and a corner between the sides in terms of step coverage in forming an inter-layer insulation film after the upper electrode is processed, which generates a variation in a film thickness of the inter-layer insulation film, consequently resulting in a variable parasitic capacitance. As the variation is generated in the parasitic capacitance due to the variation of the film thickness, the capacitance also becomes variable. Further, in the case of the upper electrode having the rectangular shape, electrical field concentration is generated at the corner parts in actual use, and reliability of the capacitance element is undermined by the electrical field concentration. Therefore, in the present invention, the corners of the first and second capacitance elements in the outer peripheral parts thereof are arranged to have an obtuse angle so that the relative precision affected by the capacitance element is improved, and the electrical field concentration locally generated can be alleviated in the actual use. In order to have the obtuse angle, the corners may be rounded, in other words, the corners may be formed into a circular shape.

A parasitic capacitance generated along a side-wall direction, other than the original capacitance, is applied to between the adjacent upper electrodes. If any interval between the upper electrodes of the adjacent capacitance elements is different to the other intervals, the parasitic capacitance undergoes the variation. Further, the capacitance element located at an outermost peripheral position has a capacitance different to that of the capacitance element located on a relatively inner side due to the variable film thickness of the inter-layer insulation film and an influence of a parasitic capacitance from a peripheral circuit element. In processing the upper electrode, the dry etching method in which reactive ions are used is often employed in order to attain a highly accurate dimension. However, in the case of adopting the dry etching method in which the reactive ions are used, the dimension is unfavorably variable since the pattern becomes irregular though the expected highly accurate dimension can be obtained. As a result, there exists an area difference between the upper electrodes of the capacitance element located in the outermost peripheral position and the capacitance element located relatively inward.

Therefore, according to the present invention, a first dummy capacitance element is placed between the first and second capacitance elements respectively adjacent to each other along a direction diagonally intersecting with a direction in parallel with the respective groups of first and second capacitance elements. Further, the interval between the adjacent first and second capacitance elements, an interval between the first capacitance element and the first dummy capacitance element adjacent to each other, and an interval between the second capacitance element and the first dummy capacitance element adjacent to each other are all equalized. Thereby, the parasitic capacitance generated between the capacitance elements, the parasitic capacitance generated between the capacitance element and the peripheral circuit element, and the deterioration of the relative precision resulting from the variation generated in processing the upper electrodes can be controlled.

According to the placement configuration of the MIM type capacitance elements of the present invention, the deterioration of the relative precision resulting from the variation of the upper electrode dimension can be controlled, the deterioration of the relative precision in the row or column direction resulting from the film thickness of the capacitance insulation film can be controlled, and the relative precision can be improved in both of the row and column direction.

Further, the relative precision affected by the parasitic capacitance can be improved, and the electrical field concentration locally generated in the actual use can be alleviated.

Further, the deterioration of the relative precision, which results from the parasitic capacitance between the capacitance elements, the parasitic capacitance from the peripheral circuit element, and the variation generated in processing the upper electrode, can be controlled.

As described, the present invention can provide the placement configuration of the MIM type capacitance elements capable of placing the two capacitance elements having the identical capacitance value with a high relative precision. Thereby, the superior placement configuration of the MIM type capacitance elements can be realized.

BRIEF DESCRIPTION OF THE DRAWINGS

These and other objects as well as advantages of the invention will become clear by the following description of preferred embodiments of the invention. A number of benefits not recited in this specification will come to the attention of the skilled in the art upon the implementation of the present invention.

DETAILED DESCRIPTION OF PREFERRED EMBODIMENTS

Figure 1:
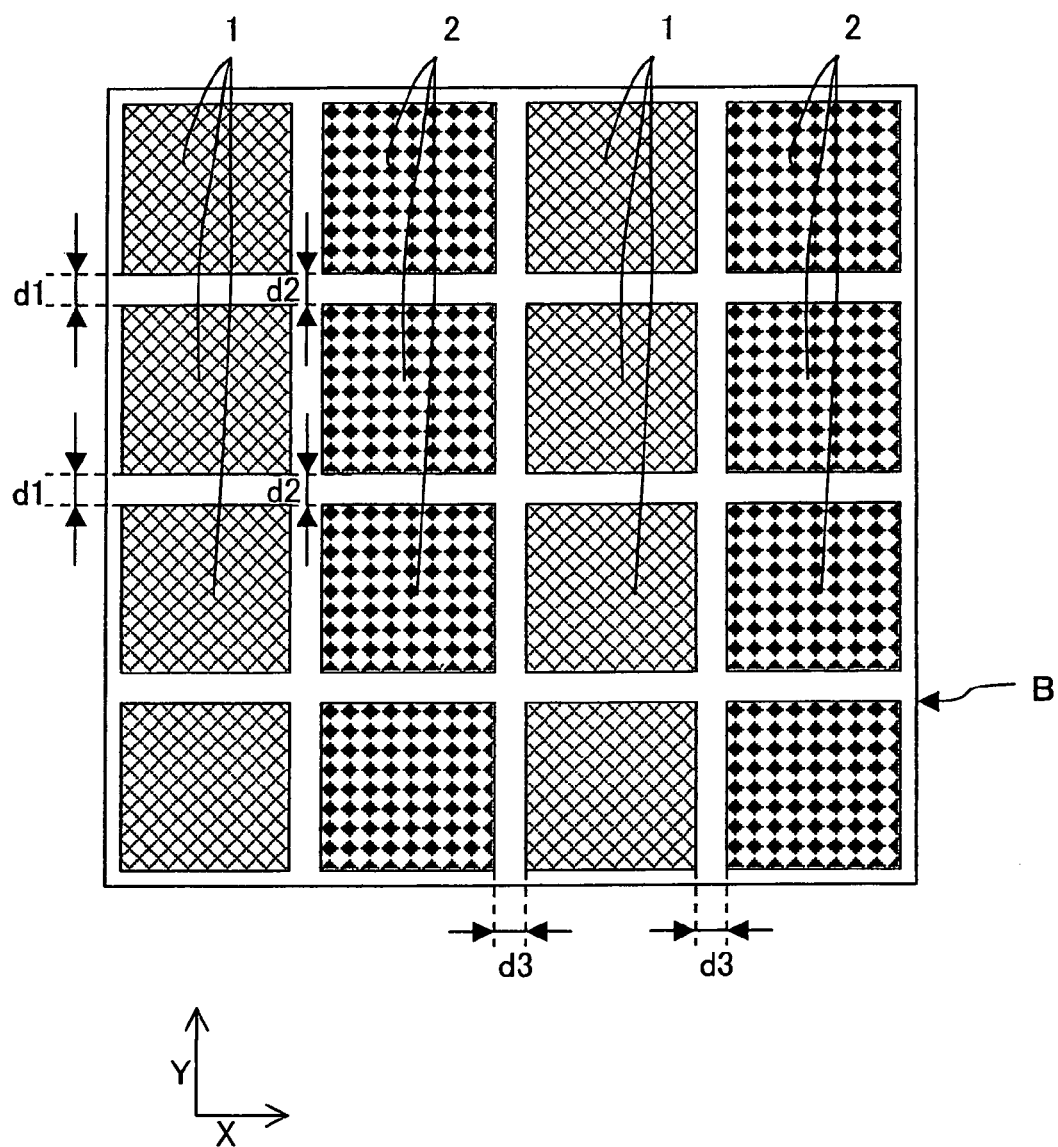
FIG. 1 is a plan view illustrating a placement configuration of MIM type capacitance elements according to a first embodiment of the present invention.

Hereinafter, preferred embodiments of the present invention are described referring to the drawings.

Embodiment 1

A first embodiment of the present invention is described referring to FIG. 1. FIG. 1 is a plan view illustrating a placement configuration of MIM type capacitance elements in a supported substrate B such as a silicon (Si) substrate or the like. The capacitance element, which is recited in the description of the present and other embodiments, basically denotes the MIM (Metal Insulator Metal) type capacitance element.

Reference numerals 1 and 2 shown in FIG. 1 respectively denote a first capacitance element and a second capacitance element. The first and second capacitance elements 1 and 2 are different capacitance elements having an identical capacitance value, which are manufactured by means of a conventional manufacturing method currently available.

In the present embodiment, groups in which the first capacitance elements 1 are adjacent to one another in a row direction (Y direction), that is, placed in tandem, and groups in which the second capacitance elements 2 are also adjacent to one another in the row direction, that is, placed in tandem, are alternately placed in a column direction (X direction), that is, transversely placed. Thereby, the group of first capacitance elements 1 and the group of second capacitance elements 2 are placed in parallel with each other along the column direction.

Further, an interval d1 between the first capacitance elements 1 adjacent to each other in the row direction, an interval d2 between the second capacitance elements 2 adjacent to each other in the row direction, and an interval d3 between the first capacitance element 1 and the second capacitance element 2 adjacent to each other in the column direction are all equalized (d1=d2=d3). In other words, all of the capacitance elements are equally spaced in both of the row and column directions. Thereby, the first capacitance elements 1 and the second capacitance elements 2 are respectively placed with the equal intervals therebetween along both of the row and column directions. An operation of the placement configuration of the MIM type capacitance elements constituted above is described below.

The capacitance value of the MIM type capacitance element is regulated by an area of an upper electrode thereof. An organic resist film having a photosensitivity is often used as a mask material used in processing the upper electrode. Due to a high contractility of the photosensitive organic resist film, a dimension of the photosensitive organic resist film is reduced toward the center of a side of a pattern as a length of the side is increased. Therefore, according to the present embodiment, the groups of first capacitance elements 1 and the groups of second capacitance elements 2 are placed in parallel with one another so that deterioration of a relative precision due to a variation of the dimension of the upper electrode can be controlled.

A capacitance insulation film undergoes such a variation in film thickness that is distributed in a plane of the Si substrate due to a method or an equipment for forming the film. Therefore, when the groups of first capacitance elements 1 and the groups of second capacitance elements 2 are alternately placed in the column direction, and all of the intervals between the capacitance elements are equalized. Thereby, the deterioration of the relative precision in the column direction, which results from the variation of the film thickness of the capacitance insulation film, can be controlled.

As described, according to the first embodiment of the present invention, the deterioration of the relative precision due to the variation of the dimension of the upper electrode can be controlled because the groups of first capacitance elements 1 and the groups of second capacitance elements 2 are respectively placed in parallel with each other. As a result, the placement configuration of the MIM type capacitance elements, which is capable of placing the two capacitance elements having the identical capacitance value with a high relative precision, can be provided.

Further, the groups of first capacitance elements 1 and the groups of second capacitance elements 2 are alternately placed in the column direction and equally spaced in parallel along the column direction so that the deterioration of the relative precision in the column direction, which results from the variation of the film thickness of the capacitance insulation film, can be controlled. As a result, the placement configuration of the MIM type capacitance elements, which is capable of placing the two capacitance elements having the identical capacitance value with a high relative precision, can be provided.

In the foregoing description of the present embodiment, shapes of the first and second capacitance elements 1 and 2 are rectangular, however, not limited to the rectangular shape as far as all of the shapes of the first and second capacitance elements 1 and 2 are identical. The rectangular shape is merely an example, and the shape of the capacitance element is not limited thereto. The first and second capacitance elements 1 and 2 may have any other polygonal shape.

As an alternative structure of the capacitance elements, the groups of first capacitance elements 1 placed in the column direction and the groups of second capacitance elements 2 also placed in the column direction may be alternately and equally spaced along the row direction, constituting an array pattern, which is contrary to the pattern in the foregoing description.

Embodiment 2

Figure 2:
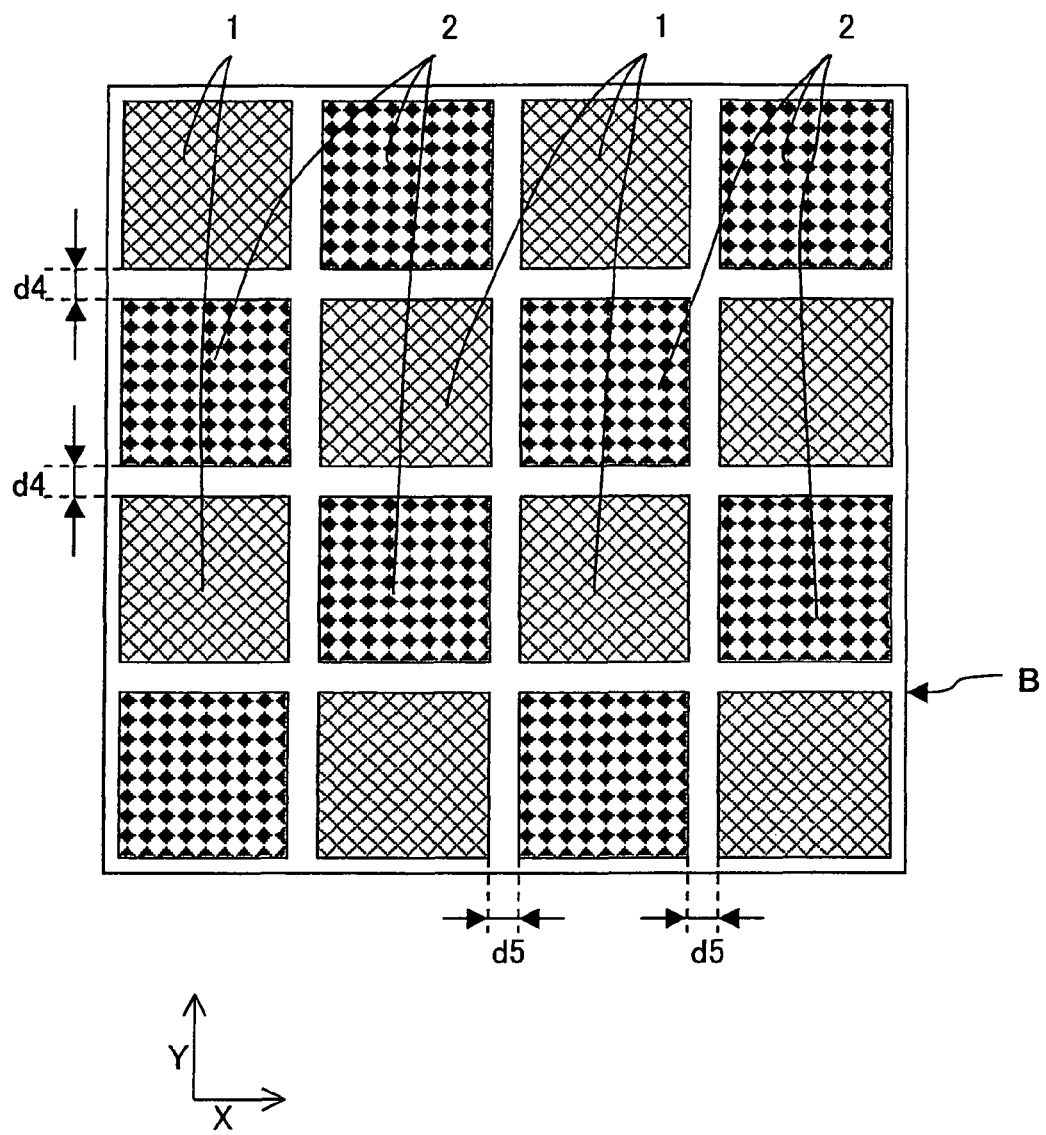
FIG. 2 is a plan view illustrating a placement configuration of MIM type capacitance elements according to a second embodiment of the present invention.

A second embodiment of the present invention is described referring to FIG. 2. FIG. 2 is a plan view illustrating a placement configuration of MIM type capacitance elements in a supported substrate B such as a silicon (Si) substrate or the like. Reference numerals 1 and 2 shown in FIG. 2 respectively denote a first capacitance element and a second capacitance element. The first and second capacitance elements 1 and 2 are different capacitance elements having an identical capacitance value, which are manufactured by means of a conventional manufacturing method currently available.

In the present embodiment, the first capacitance elements 1 and the second capacitance elements 2 are alternately placed along both of the row and column directions. Thereby, the first and second capacitance elements 1 and 2 are placed in a grid pattern along the row and column directions, in other words, placed in an array pattern. Further, the first and second capacitance elements 1 and 2 are arrayed in a checkerboard pattern.

Further, an interval d4 between the first and second capacitance elements 1 and 2 adjacent to each other in the row direction and an interval d5 between the first and second capacitance elements 1 and 2 adjacent to each other in the column direction are equalized. All of the intervals d4 and d5 are equalized. Thereby, the first and second capacitance elements 1 and 2 are placed in the array pattern with the equal intervals therebetween along both of the row and column directions.

An operation of the placement configuration of the MIM type capacitance elements constituted above is described below. In the present embodiment, the first and second capacitance elements 1 and 2 having the structure described in the first embodiment are alternately placed not only in the column direction but also in the row direction. Further, the intervals d4 and d5 between the respective capacitance elements adjacent to one another in the row and column directions are all equalized (d4=d5). Thereby, the deterioration of the relative precision in both of the row and column directions, which results from the variation of the film thickness of the capacitance insulation film, can be controlled.

As described, according to the second embodiment of the present invention, the first and second capacitance elements 1 and 2 are alternately placed with the equal intervals therebetween in the row and column directions in addition to the placement configuration of the MIM type capacitance elements according to the first embodiment so that the relative precision not only in the column direction but also in the row direction can be improved. As a result, the placement configuration of the MIM type capacitance elements, which is capable of placing the two capacitance elements having the identical capacitance value with a high relative precision, can be provided.

The shapes of the first and second capacitance elements 1 and 2 are not limited to the shape shown in FIG. 2 as described in the first embodiment.

Embodiment 3

Figure 3:
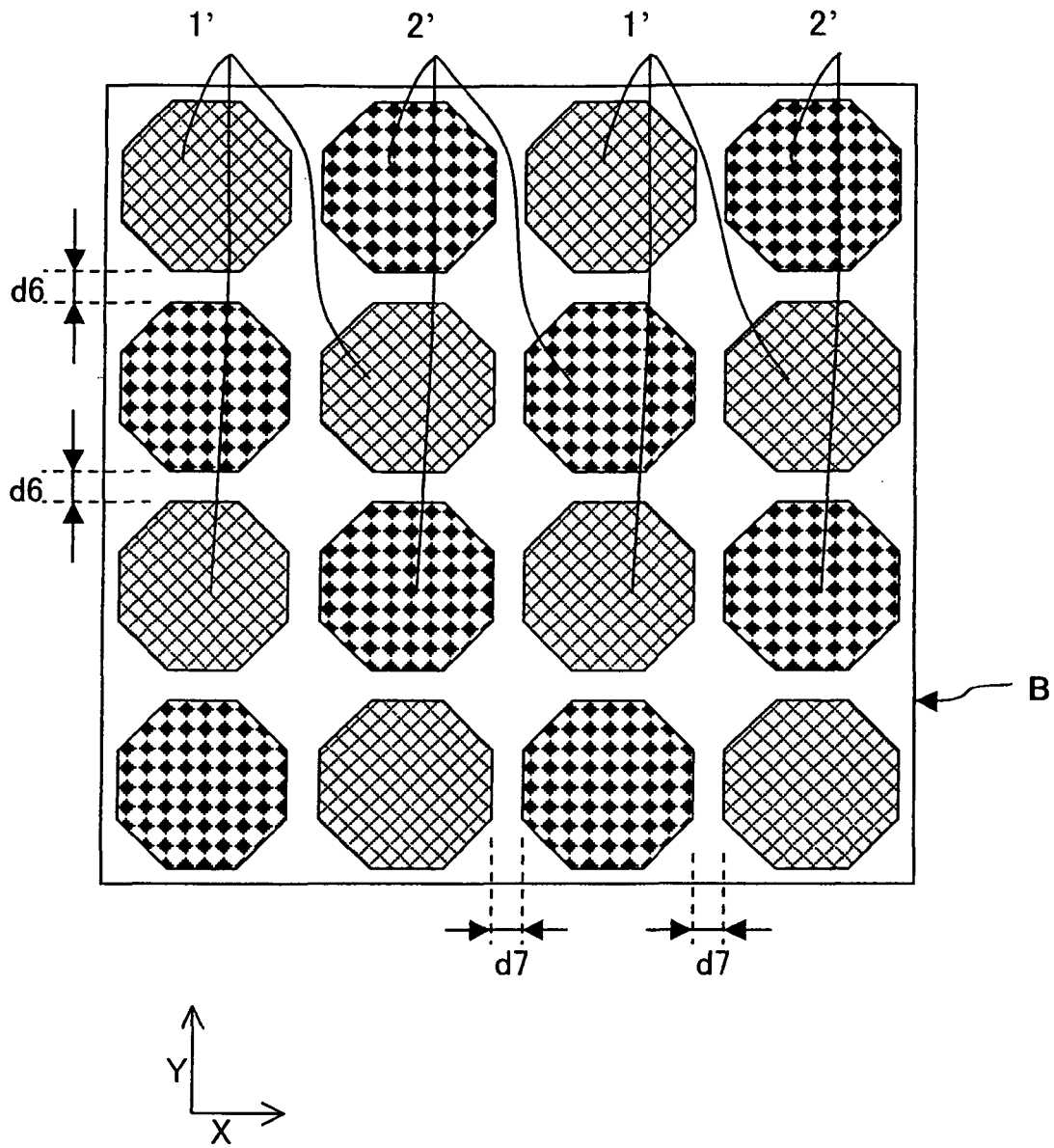
FIG. 3 is a plan view illustrating a placement configuration of MIM type capacitance elements according to a third embodiment of the present invention.

A third embodiment of the present invention is described referring to FIG. 3. FIG. 3 is a plan view illustrating a placement configuration of MIM type capacitance elements. Reference numerals 1' and 2' shown in FIG. 3 respectively denote a first capacitance element and a second capacitance element.

A basic constitution according to the present embodiment is the same as described in the second embodiment. The first and second capacitance elements 1' and 2' are alternately placed not only in the row direction but also in the column direction to thereby constitute the array pattern. An interval d6 between the first and second capacitance elements 1' and 2' in the row direction and an interval d7 between the first and second capacitance elements 1' and 2' in the column direction are equal (d6=d7).

The present embodiment is characterized in that corners of the first and second capacitance elements 1' and 2' have an obtuse angle, in other words, shapes of the first and second capacitance elements 1' and 2' are octagonal. An operation of the placement configuration of the MIM type capacitance elements constituted above is described below.

The rectangular shape as shown in FIG. 1 or 2 is often adopted as the shape of the MIM type capacitance element (more specifically, shape of the upper electrode). However, when the rectangular shape is adopted, there is a difference between each side and a corner between the sides in terms of step coverage in forming the inter-layer insulation film after the upper electrode is processed, which generates a variation in the film thickness of the inter-layer insulation film, consequently resulting in a variable parasitic capacitance. The variation in the parasitic capacitance generates a variation in the capacitance. Further, in the case of the upper electrode having the rectangular shape, electrical field concentration is generated at the corner parts when actually used, and reliability of the capacitance element is undermined by the electrical field concentration.

Therefore, the corners of the fist and second capacitance elements 1' and 2' in the outer peripheral parts thereof are arranged to have the obtuse angle in the present embodiment. As a result, the relative precision affected by the parasitic capacitance can be improved, and the electrical field concentration locally generated in the actual use can be alleviated.

As described, according to the third embodiment, the corners of the first and second capacitance elements 1' and 2' are arranged to have the obtuse angle so that the relative precision affected by the parasitic capacitance can be improved and the electrical field concentration that is locally generated in the actual use can be alleviated in addition to the effect obtained in the second embodiment. As a result, the placement configuration of the MIM type capacitance elements, which is highly reliable and capable of placing the two capacitance elements having the identical capacitance value with a high relative precision, can be provided.

The shapes of the first and second capacitance elements 1' and 2' having the obtuse angle may include such an arrangement that the corners are rounded to show curved lines. The number of the corners of the polygonal shape is not particularly limited. The corners of the rectangular capacitance elements, for example, as shown in FIG. 1 or 2, may be rounded, or the corners of the capacitance elements having a polygonal shape more than a pentagonal shape may be rounded. In the both cases, the same effect can be obtained. As is clear in the foregoing description, the obtuse angle recited in the present invention is slightly different to a generally-speaking obtuse angle and represents a concept which is somewhat broader than in general.

Figure 4:
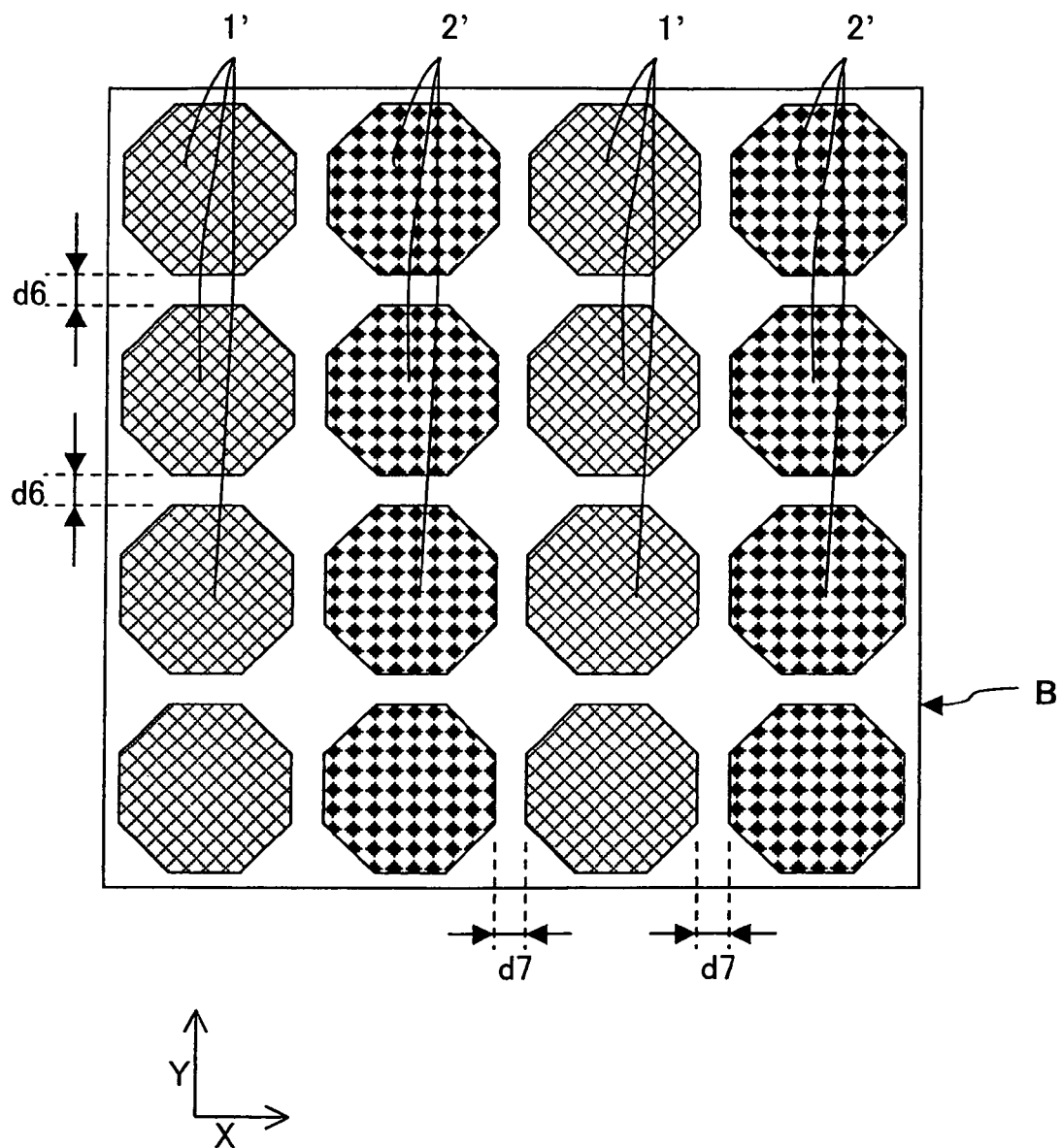
FIG. 4 is a plan view illustrating a placement configuration of MIM type capacitance elements according to a modified embodiment of the third embodiment.

Further, as shown in FIG. 4, the constitution described in the present embodiment (the corners of the capacitance element have the obtuse angle) may be applied to the placement configuration of the MIM type capacitance elements according to the first embodiment, wherein the groups of first capacitance elements 1 and second capacitance elements 2 aligned in the row direction or the column direction are alternately placed in the row direction or the column direction.

Embodiment 4

Figure 5:
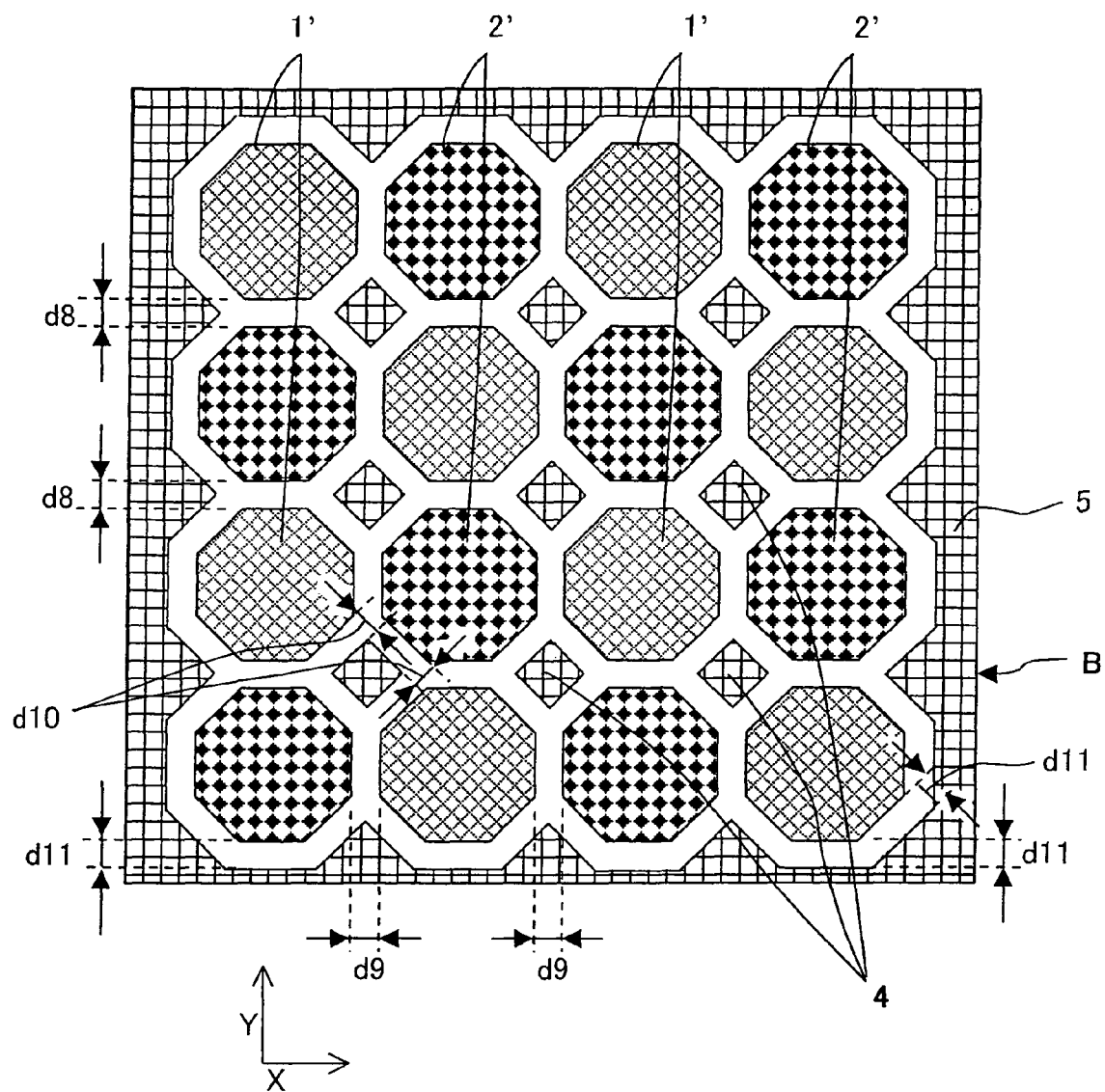
FIG. 5 is a plan view illustrating a placement configuration of MIM type capacitance elements according to a fourth embodiment of the present invention.

A fourth embodiment of the present invention is described referring to FIG. 5. FIG. 5 is a plan view illustrating a placement configuration of MIM type capacitance elements in a supported substrate B such as a silicon (Si) substrate or the like. Reference numerals 1' and 2' shown in FIG. 5 respectively denote a first capacitance element and a second capacitance element, and reference numerals 4 and 5 in the drawing respectively denote a first dummy capacitance element and a second dummy capacitance element. The first and second capacitance elements 1' and 2' are different capacitance elements having an identical capacitance value, which are manufactured by means of a conventional manufacturing method currently available.

In the present embodiment, the first and second capacitance elements 1' and 2' whose corners have the obtuse angle are alternately placed not only in the column direction but also in the row direction.

Further, in the present embodiment, the dummy capacitance elements 4 are respectively placed between the first capacitance elements 1' and 1' adjacent to one another in a direction between the row direction (Y direction) and the column direction (X direction) orthogonally intersecting with each other and diagonally oblique with respect to the row and column directions (hereinafter, referred to as the oblique direction, the obliquity in FIG. 4 is 45 degrees) and between the second capacitance elements 2' and 2' adjacent to one another in the oblique direction. Further, the annular second dummy capacitance elements 5 are placed so as to surround sections where the first and second capacitance elements 1' and 2' are placed. Further, an interval d8 between the first capacitance element 1' and the second capacitance element 2' in the row direction, an interval d9 between the first capacitance element 1' and the second capacitance element 2' in the column direction, an interval d10 between the first and second capacitance elements 1' and 2' and the first dummy capacitance element 4 in the oblique direction, and an interval d11 between the first and second capacitance elements 1' and 2' and the second dummy capacitance element 5 are all equalized (d8=d9=d10=d11).

An operation of the placement configuration of the MIM type capacitance elements constituted above is described below. A parasitic capacitance along a side-wall direction, other than the original capacitance, is applied to between the adjacent first and second capacitance elements 1' and 2' (more specifically, between upper electrodes thereof). The parasitic capacitance undergoes a variation when any of the intervals d8 and d9 between the adjacent first and second capacitance elements 1' and 2' and the intervals d10 and d11 between the first and second capacitance elements 1' and 2' and the first and second dummy electrodes 4 and 5 is not equal to the other intervals. Further, a capacitance variation is generated between capacitance elements (1')' and (2')' located in an outermost periphery and the first and second capacitance elements 1' and 2' adjacent to the capacitance elements (1')' and (2')' due to the variation of the film thickness of the inter-layer insulation film and influence of the parasitic capacitance from the peripheral circuit element.

As a further advantage, the dry etching method in which reactive ions are used is often adopted in processing the upper electrode of the capacitance element in order to attain a highly accurate dimension. However, in the case of adopting the dry etching method in which the reactive ions are used, the processed dimension is unfavorably variable since the pattern becomes irregular though the expected highly accurate dimension can be obtained. As a result, due to the variation generated in the processed dimension, there is an area difference between the upper electrodes of the capacitance elements (1')' and (2')' located in the outermost periphery and the capacitance elements 1' and 2' located adjacent thereto. Such an area difference can also be a factor for deteriorating the relative precision.

Therefore, according to the present embodiment, the first dummy capacitance element 4 is placed between the first capacitance element 1 and the second capacitance element 2, and the second dummy capacitance element 5 is placed in the outermost periphery of the array. Further, the intervals dB and d9 between the first capacitance elements 1' and the second capacitance elements 2', the interval d10 between the first and second capacitance elements 1' and 2' and the first dummy capacitance element 4, and the interval d11 between the first and second capacitance elements 1' and 2' and the second dummy capacitance element 5 are all equalized (d8=d9=d10=d11). Thereby, the deterioration of the relative precision, which results from the parasitic capacitance between the capacitance elements, the parasitic capacitance from the peripheral circuit element, and the variation generated in processing the upper electrode, can be controlled.

As described, according to the fourth embodiment of the present invention, the first and second dummy capacitance elements 4 and 5 are placed so that all of the intervals d8, d9, d10 and d11 can be equal, and the deterioration of the relative precision, which results from the parasitic capacitance between the capacitance elements, the parasitic capacitance from the peripheral circuit element, and the variation generated in processing the upper electrode, can be controlled in addition to the effect obtained in the third embodiment. As a result, the placement configuration of the MIM type capacitance elements, which is capable of placing the two capacitance elements having the identical capacitance value with a high relative precision, can be provided.

In the foregoing description, the shape of the dummy capacitance element 5 in the outermost periphery is annular. However, the first and second capacitance elements (1')' and (2')' in the outermost periphery may be used as the second dummy capacitance element 5 as far as the respective intervals dB, d9, d10 and d11 between the capacitance elements are all equal. Further, the annular first dummy capacitance element 4 may be formed in the outer periphery of the first and second capacitance elements 1' and 2'. In the both cases, the same effect can be obtained.

The shapes of the first and second capacitance elements 1' and 2' are not limited to the octagonal shape, and any shape can be adopted as far as the adopted shape allows the placement of the first and second dummy capacitance elements 4 and 5. The shape includes a number of different shapes in which the corners have the obtuse angle.

Figure 6:
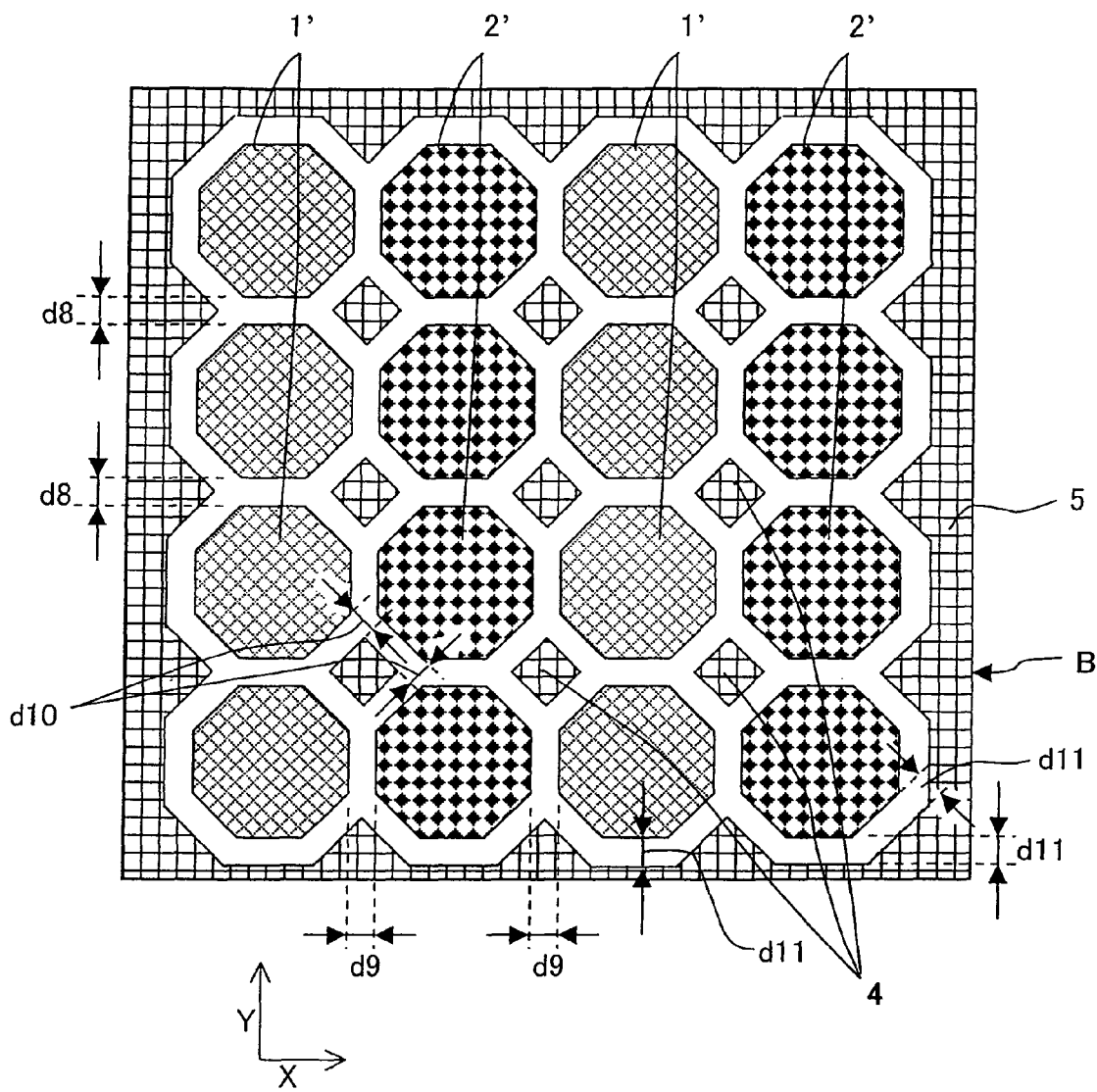
FIG. 6 is a plan view illustrating a placement configuration of MIM type capacitance elements according to a first modified embodiment of the fourth embodiment.

As a possible constitution, the corners of the capacitance elements are arranged to have the obtuse angle and the first and second dummy capacitance elements 4 and 5 are placed in the placement configuration of the MIM type capacitance elements according to the first embodiment, wherein the group of first capacitance elements 1 and the group of second capacitance elements 2 are alternately placed in the row direction or the column direction as shown in FIG. 6.

Figure 7:
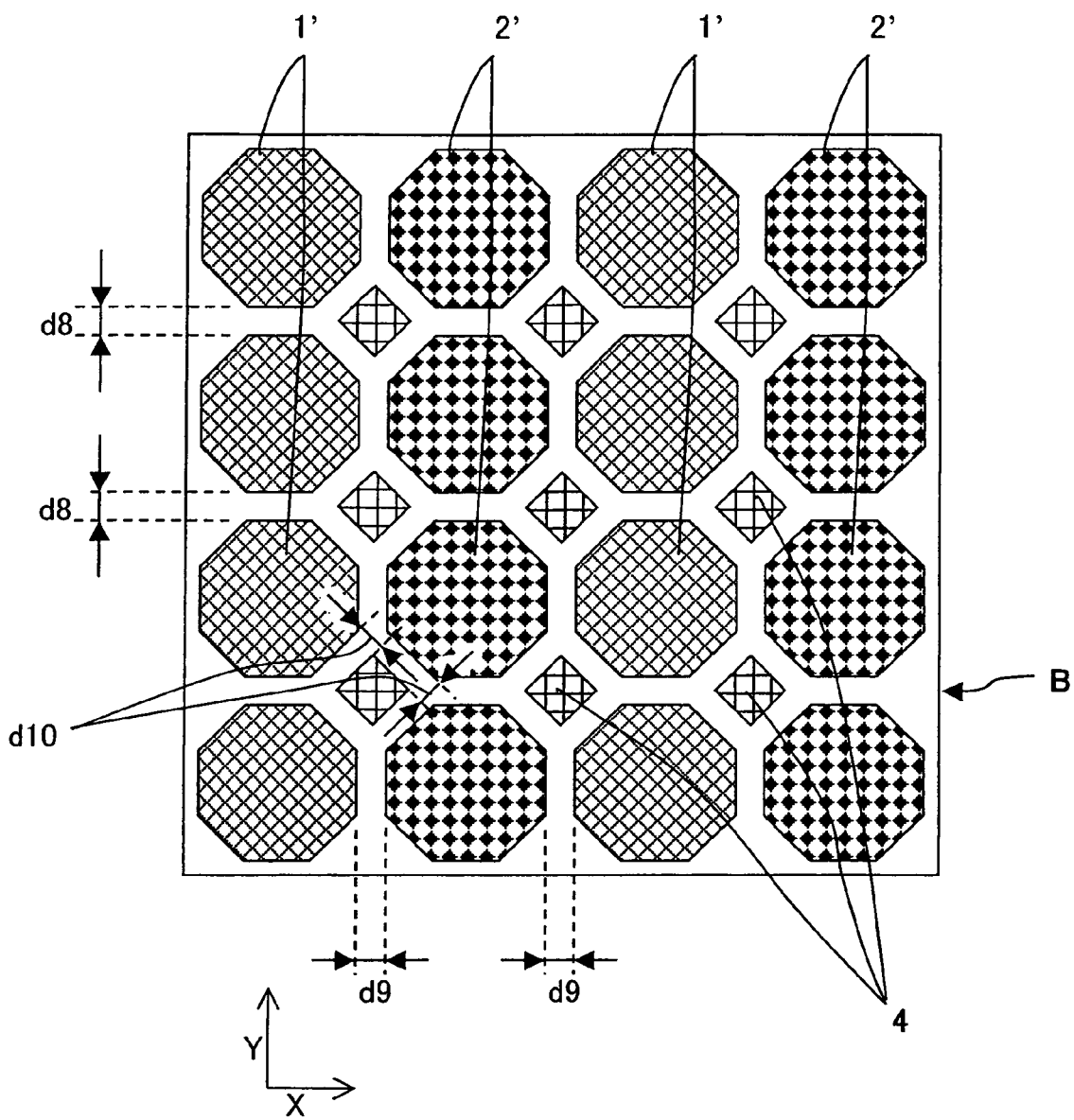
FIG. 7 is a plan view illustrating a placement configuration of MIM type capacitance elements according to a second modified embodiment of the fourth embodiment.
Figure 8:
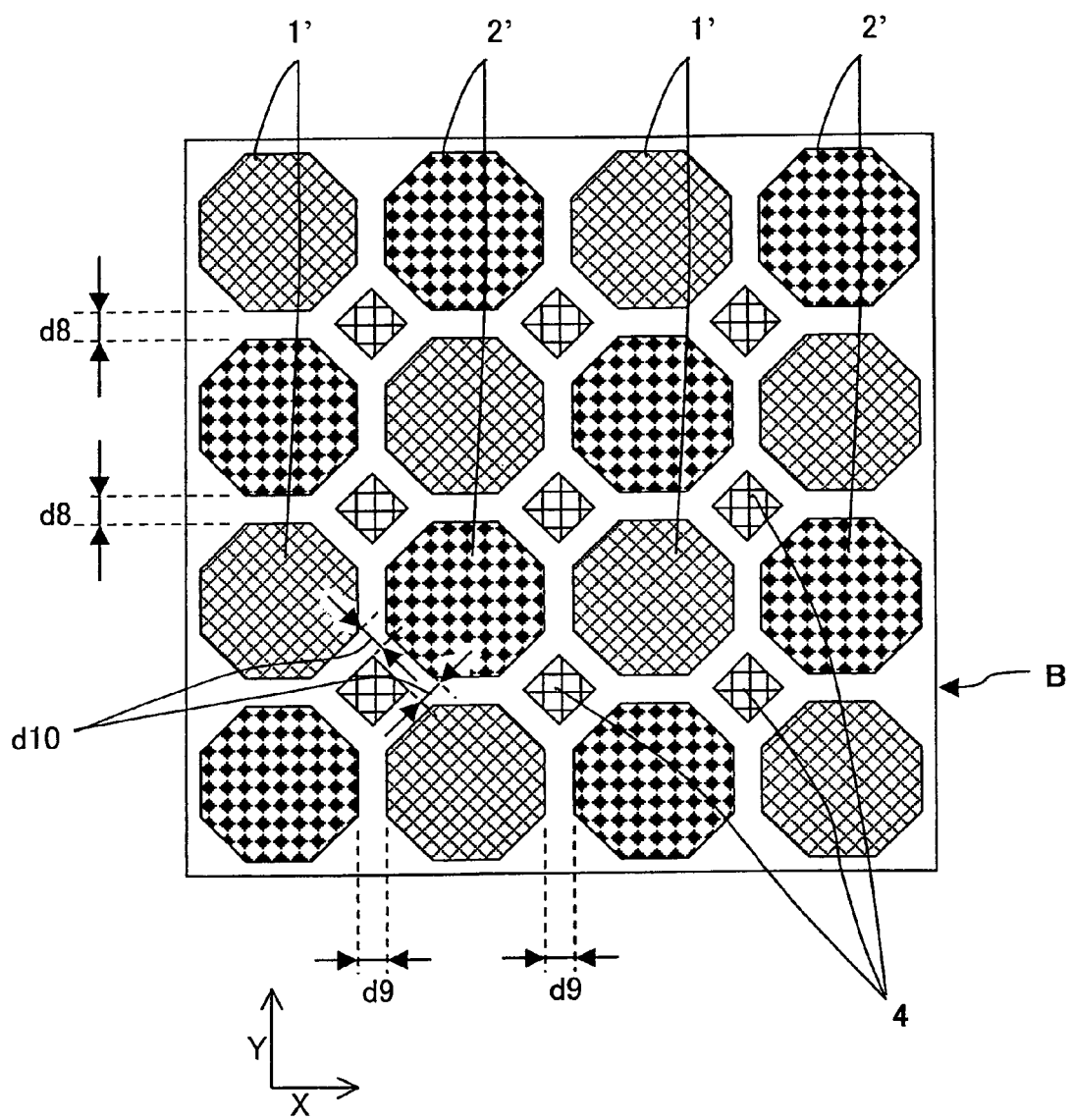
FIG. 8 is a plan view illustrating a placement configuration of MIM type capacitance elements according to a third modified embodiment of the fourth embodiment.

Further, as shown FIGS. 7 and 8, the first dummy capacitance elements 4 may be provided in the placement configurations of the MIM type capacitance elements according to the first and second embodiments, or the second dummy capacitance elements 5 may be provided in the placement configurations of the MIM type capacitance elements according to the first and second embodiments. In these examples, the dummy capacitance elements are used as the outermost peripheral capacitance elements so that the relative precision can be further improved.

All of the embodiments of the present invention were described based on the array in which the 4×4 first and second capacitance elements 1 and 2 are aligned, which, however, does not necessarily limit the size of the array. Further, it is obvious that a routing method, type and thickness of each of various films, quality of used materials, formation method, formation conditions and the like are not subject to any limitation in all of the embodiments of the present invention.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. A placement configuration of MIM type capacitance elements comprising:
    a first group of a plurality of first MIM capacitance elements are placed in rows; and
    a second group of a plurality of second MIM capacitance elements are placed in rows, wherein
    the first group of the plurality of first MIM capacitance elements and the second group of the plurality of second MIM capacitance elements are placed in parallel with each other with an equal interval therebetween,
    a plurality of first dummy capacitance elements are provided between the first group of the plurality of first MIM capacitance elements and the second group of the plurality of second MIM capacitance elements, and
    a plurality of second dummy capacitance elements are provided at an outermost circumference of the first group of the plurality of first MIM capacitance elements and the second group of the plurality of second MIM capacitance elements.

2. The placement configuration of MIM type capacitance elements as claimed in claim 1, wherein
    the first MIM capacitance element and the second MIM capacitance element have an identical capacitance.

3. The placement configuration of MIM type capacitance elements as claimed in claim 1, wherein
    corners in outer peripheral parts of the first MIM capacitance elements and corners in outer peripheral parts of the second MIM capacitance elements are arranged to have an obtuse angle or rounded.

4. A placement configuration of MIM type capacitance elements as claimed in claim 1, wherein the plurality of first dummy capacitance elements are placed in rows and in parallel with the first group of the plurality of first MIM capacitance elements and the second group of the plurality of second MIM capacitance elements.

5. A placement configuration of MIM type capacitance elements as claimed in claim 1, wherein
an interval between the plurality of first MIM capacitance elements and the plurality of first dummy capacitance elements and an interval between the plurality of second MIM capacitance elements and the plurality of first dummy capacitance elements are the same.

6. A placement configuration of MIM type capacitance elements as claimed in claim 1, wherein
an interval between the plurality of first MIM capacitance elements and the plurality of second dummy capacitance elements and an interval between the plurality of first MIM capacitance elements and the plurality of first dummy capacitance elements are the same.

7. A placement configuration of MIM type capacitance elements as claimed in claim 1, wherein
an interval between each adjacent MIM capacitance element of the plurality of the first MIM capacitance elements and an interval between the first MIM capacitance elements and the first dummy capacitance elements are the same.

8. A placement configuration of MIM type capacitance elements as claimed in claim 1, wherein
an interval between the second MIM capacitance elements and the second dummy capacitance elements and an interval between the second MIM capacitance elements and the first dummy capacitance elements are the same.

9. A placement configuration of MIM type capacitance elements as claimed in claim 1, wherein
an interval between each adjacent MIM capacitance element of the plurality of the second MIM capacitance elements and an interval between the second MIM capacitance elements and the first dummy capacitance elements are the same.

10. A placement configuration of MIM type capacitance elements as claimed in claim 1, wherein
the first and second MIM capacitance elements in the outermost periphery may be used as the second dummy capacitance element.

11. A placement configuration of MIM type capacitance elements as claimed in claim 1, wherein
the plurality of first dummy capacitance elements and the plurality of second dummy capacitance elements each has an identical form with the plurality of first MIM capacitance elements and the plurality of second MIM capacitance elements each.

12. A placement configuration of MIM type capacitance elements, wherein
a plurality of first MIM capacitance elements and a plurality of second MIM capacitance elements are alternately placed along row and column directions,
an interval between the first and second MIM capacitance elements adjacent to each other in the row direction and an interval between the first and second MIM capacitance elements adjacent to each other in the column direction are all equalized,
a first dummy capacitance is provided between the plurality of first MIM capacitance elements and the plurality of second MIM capacitance elements, and
a second dummy capacitance element is provided at an outermost circumference of the plurality of first MIM capacitance elements and the plurality of second MIM capacitance elements.

13. The placement configuration of MIM type capacitance elements as claimed in claim 12, wherein
the first MIM capacitance element and the second MIM capacitance element have an identical capacitance.

14. The placement configuration of MIM type capacitance elements as claimed in claim 12, wherein
corners in outer peripheral parts of the first MIM capacitance elements and corners in outer peripheral parts of the second MIM capacitance elements are arranged to have an obtuse angle or rounded.

15. The placement configuration of MIM type capacitance elements as claimed in claim 12, wherein
an interval between the plurality of first MIM capacitance elements and the first dummy capacitance element and an interval between the plurality of second MIM capacitance elements and the first dummy capacitance elements are the same.

16. The placement configuration of MIM type capacitance elements as claimed in claim 7, wherein
an interval between the plurality of first MIM capacitance elements and the second dummy capacitance element and an interval between the plurality of first MIM capacitance elements and the first dummy capacitance element are the same.

17. The placement configuration of MIM type capacitance elements as claimed in claim 7, wherein
an interval between the plurality of second MIM capacitance elements and the second dummy capacitance element and an interval between the plurality of second MIM capacitance elements and the first dummy capacitance element are the same.

18. The placement configuration of MIM type capacitance elements as claimed in claim 12, wherein
the first and second MIM capacitance elements in the outermost periphery may be used as the second dummy capacitance element.

19. The placement configuration of MIM type capacitance elements as claimed in claim 12, wherein the second dummy capacitance element has an identical form with the each of the plurality of first MIM capacitance elements and each of the plurality of second MIM capacitance elements.

* * * * *